(12) United States Patent
Saito et al.

(10) Patent No.: US 8,198,549 B2
(45) Date of Patent: Jun. 12, 2012

(54) MULTI-LAYER PRINTED WIRING BOARD

(75) Inventors: Shunichi Saito, Tokyo (JP); Toshio Sugano, Tokyo (JP); Atsushi Hiraishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 984 days.

(21) Appl. No.: 12/004,020

(22) Filed: Dec. 20, 2007

(65) Prior Publication Data

US 2008/0164058 A1 Jul. 10, 2008

(30) Foreign Application Priority Data

Dec. 25, 2006 (JP) .................. 2006-347849

(51) Int. Cl.
*H05K 1/11* (2006.01)

(52) U.S. Cl. ...................................... 174/262

(58) Field of Classification Search .................. 174/262, 174/256, 260, 261, 263, 266
See application file for complete search history.

(56) References Cited

U.S. PATENT DOCUMENTS

| 6,590,165 | B1 | 7/2003 | Takada et al. | |
|---|---|---|---|---|
| 7,277,298 | B2 | 10/2007 | Ohsaka | |
| 7,453,704 | B2 | 11/2008 | Tanaka et al. | |
| 2003/0150644 | A1 | 8/2003 | Takada et al. | |
| 2005/0269128 | A1* | 12/2005 | Usui et al. | 174/256 |
| 2008/0271914 | A1 | 11/2008 | Tanaka et al. | |

FOREIGN PATENT DOCUMENTS

| JP | 61-208169 A | 9/1986 |
|---|---|---|
| JP | 8-107280 A | 4/1996 |
| JP | 8-274471 A | 10/1996 |
| JP | 10-322027 | 12/1998 |
| JP | 2000-004086 A | 1/2000 |
| JP | 2006-128633 A | 5/2006 |
| JP | 2006-303003 A | 11/2006 |

* cited by examiner

*Primary Examiner* — Jeremy C. Norris
*Assistant Examiner* — Tremesha S Willis
(74) *Attorney, Agent, or Firm* — Foley & Lardner LLP

(57) ABSTRACT

A multi-layer printed circuit board for mounting memories, includes: laminated wiring layers on which wiring is arranged; and a plurality of interlayer connection components which electrically connect at least two of the wiring layers. At least one of the plurality of interlayer connection components is a blind via-hole.

6 Claims, 18 Drawing Sheets

MULTI-LAYER PRINTED WIRING BOARD

BACKGROUND OF THE INVENTION

1. Field of the Invention

The present invention relates to a multi-layer printed circuit board. This application is based on Japanese Patent application No. 2006-347849, the disclosure of which is incorporated herein by reference.

2. Description of Related Art

In recent years, the package shape of a semiconductor device (hereafter, to be referred to as a logic part) for controlling a storage unit such as a memory is changed from a lead type to a CSP (Chip Size Package) type in which power source pins, ground pins and input/output pins can be arranged in a high density. At the same time, the increase in the number of the pins in the package is advanced, and restriction on pattern design of the printed circuit board on which the package is mounted is also increased.

FIGS. 1 to 3 show the outer appearance of a logic part. FIG. 1 is a top view of the logic part, FIG. 2 is a side view, and FIG. 3 is a view showing the rear side of the logic part. As shown in FIG. 3, many terminals are arranged on the rear side of the logic part. It should be noted that in FIG. 3, terminals for power sources and ground pins are shown inside the dashed line.

The configuration of the printed circuit board for mounting the above logic part will be described below with reference to FIGS. 4 to 8. In FIGS. 5 to 8, an inter-layer connection component 1 for the connection between wiring layers, a conductor pattern 2, and a mounting pad of the logic part are shown in FIGS. 5 to 8. FIG. 4 shows a part mounting surface of the printed circuit board, FIG. 5 shows a rear surface thereof, and FIGS. 6 and 7 show the inner wiring layers, respectively. FIG. 8 is an expanded view of a portion of the part mounting surface.

As shown in FIG. 4, a large number of mounting pads 3 for mounting the logic part are provided on the part mounting surface in correspondence to terminals on the rear surface of the logic part. Conductors for signal lines are connected to the respective mounting pads 3. Here, a conductor pattern 2 extending on the part-mounting surface is connected to the mounting pad 3 arranged on the relatively outer section side.

On the other hand, by a wiring only on the part mounting surface, the signal line cannot be connected to the mounting pad 3 arranged on the central section side among the mounting pads 3. This is because a space between the mounting pads 3 is occupied by the conductor patterns 2 extending for the mounting pads 3 on the relatively outer section side. Thus, an inter-layer connection component 1 is arranged to connect the mounting pad 3 on the central section side. That is, as shown in FIGS. 6 and 7, in the inner layer, the conductor pattern 2 as the signal line is extended to the central section and connected through the inter-layer connection component 1 to the mounting pad 3 on the part mounting surface.

As the above-mentioned inter-layer connection component 1, there are known a through-hole penetrating from the front to the rear of the board, a lead insertion hole described in a first conventional example (Japanese Laid Open Patent Application (JP-P2000-4086A)) and a via-holes described in a second conventional example (Japanese Laid Open Patent Application (JP-A-Heisei, 10-322027)).

If the via-hole and the lead insertion hole are used as the inter-layer connection components 1, it is possible to selectively connect a segment between the wiring layers. However, they require the manufacturing steps whose number is greater than that of the through-hole. Thus, in a memory mounting printed circuit board, the penetration through-holes have been used as the inter-layer connection components.

In association with the increase in the number of pins in the logic part, wiring layers in the printed circuit board trend to be increased. As a specific example, when a wiring rule is considered in which one conductive pattern is arranged between the penetration through-holes, one wiring layer is required to be added to the printed circuit board each time the terminals of the logic part are increased for one line. FIGS. 6 and 7 show such states. The increase in the wiring layer causes severe restriction on the printed circuit board design for a memory module. In the printed circuit board for the memory module, since the current form factors such as a socket are used, it is difficult to change the thickness of the printed circuit board. That is, the number of the layers must be increased without any change in the total thickness of the printed circuit board, and the thickness for one layer must be made thin. However, in case of the trial to make the thickness of each layer thin, a limit is in the process of manufacturing a fine structure of a conductor wiring and a constraint is from the viewpoint of the characteristic impedance of the wiring. Specifically, in the current memory module printed circuit board, it is difficult to exceed the 10 layers.

Also, the increase in the number of pins in the logic part is required to be attained without any increase in the impedances of a power source wiring and a ground wiring on the printed circuit board. Anti-pads 5 to protect a short-circuit are required to be arranged at the positions corresponding to the penetration through-holes in all of the power source and ground layers in the printed circuit board. FIG. 9 is a diagram showing the anti-pad 5. In FIG. 9, the inter-layer connection component 1, a conductor 6, and a space 4 to prevent the short-circuit are shown.

FIG. 10 shows a design example of the power source layer and ground layer in the board design shown in FIGS. 4 to 8. As shown in FIG. 10, a power source and ground area 6 is removed by the anti-pads 5. That is, the power source and ground area is removed, resulting in the increase in the impedances of the power source and ground wirings in the printed circuit board.

Therefore, the printed circuit board is demanded in which the number of pins in the logic part can be increased while suppressing the increase in the impedances of the power source and the ground wiring.

Also, in the memory module, the memories and the logic parts must be efficiently mounted on the printed circuit board. Thus, parts for decreasing the impedances of the power source and the ground wirings can be efficiently mounted on the opposite side to the logic parts, FIGS. 11 and 12 show this situation.

FIG. 11 shows an example in which a typical logic part 8 and impedance decreasing parts 9 (9a to 9e) such as a chip capacitor are mounted on a printed circuit board 7, and FIG. 12 shows an example in which the logic part 8 for the memory module, the memories 10a and 10b and an impedance decreasing part 9 are mounted on a printed circuit board 7. As shown in FIG. 11, in case of a typical module, many impedance decreasing parts 9 can be mounted on the printed circuit board 7 on the side opposite to the logic part 8. On the contrary, in case of the memory module shown in FIG. 12, the memories 10 must be mounted on the printed circuit board 7 on the side opposite to the logic part 8. Accordingly, the number of the mountable impedance decreasing parts 9 is extremely reduced. Thus, in the printed circuit board on which the memories are mounted, it is difficult to desirably decrease the impedance. That is, in particular, in the printed circuit board on which the memories are mounted, a technique is demanded that the increase of the impedance can be suppressed.

SUMMARY

An object of the present invention is provide a multi-layer printed circuit board that can suppress the increase in the impedance.

In a first aspect of the present invention, a multi-layer printed circuit board for mounting memories, includes: laminated wiring layers on which wiring are arranged; and a plurality of interlayer connection components which electrically connect at least two of the wiring layers. At least one of the plurality of interlayer connection components is a blind via-hole.

According to the present invention, a multi-layer printed circuit board that can suppress the increase in the impedance is provided.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a multi-layer printed circuit board of embodiments of the present invention will be described in detail with reference to the attached drawings.

First Embodiment

Figure 13:
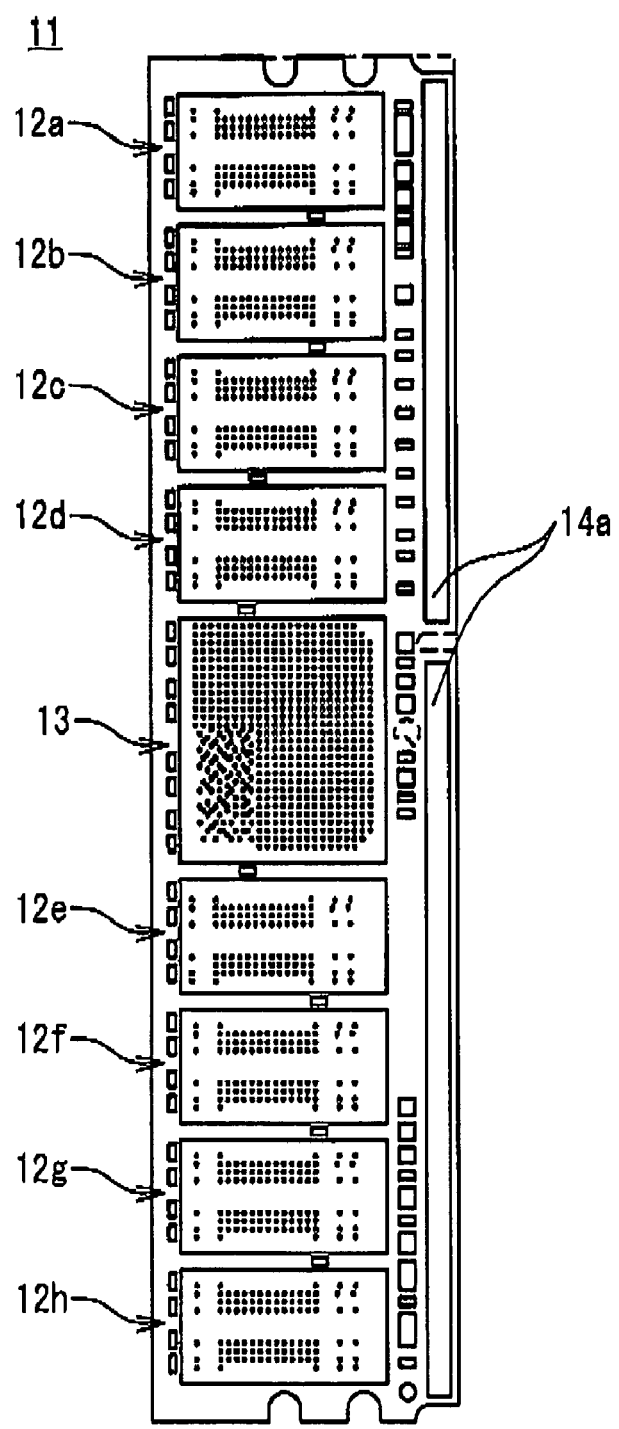
FIG. 13 is a top view of a multi-layer printed circuit board according to a first embodiment of the present invention.
Figure 14:
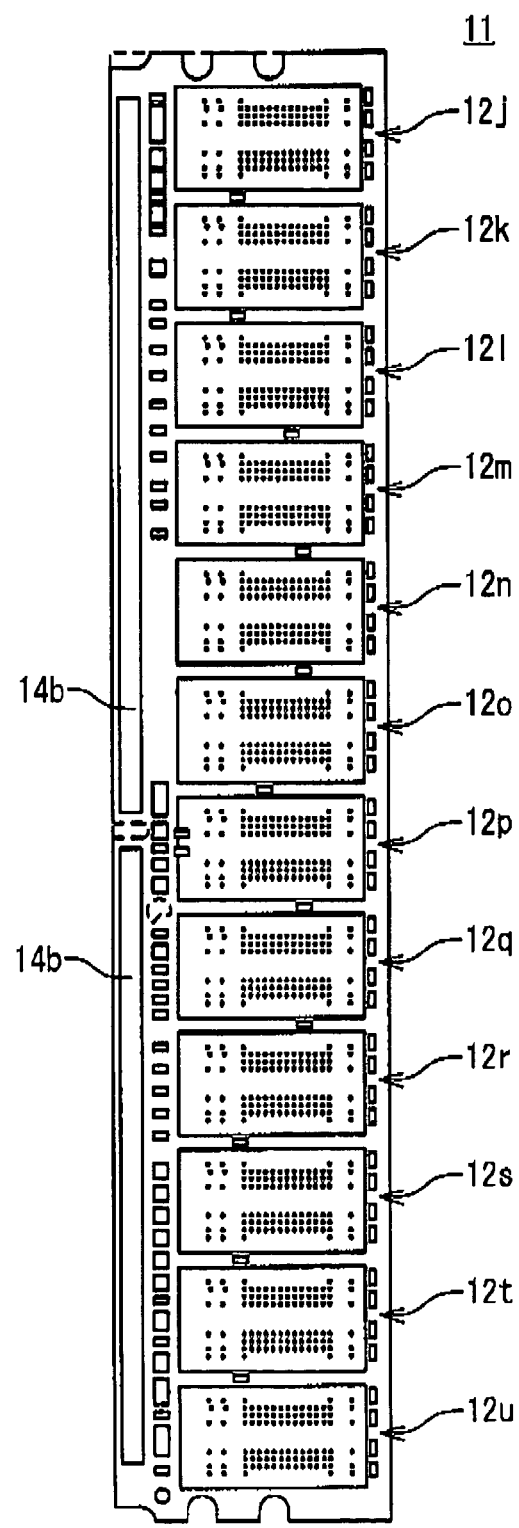
FIG. 14 is a rear view of the multi-layer printed circuit board according to the first embodiment.

FIG. 13 is a top view of a multi-layer printed circuit board 11 according to a first embodiment of the present invention, and FIG. 14 is a rear view showing the rear surface thereof. As shown in FIGS. 13 and 14, areas 12 (12a to 12u) for mounting memories, an area 13 for mounting a logic part and board connectors 14 (14a, 14b) are provided on the top and rear surfaces of the multi-layer printed circuit board 11.

Figure 15:
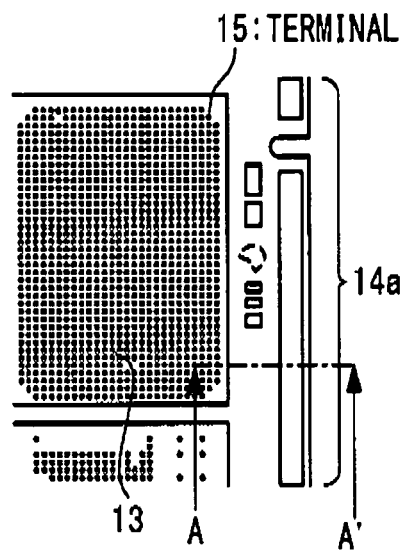
FIGS. 15 and 16 are partially expanded views showing portions of the multi-layer printed circuit board in the first embodiment.
Figure 16:
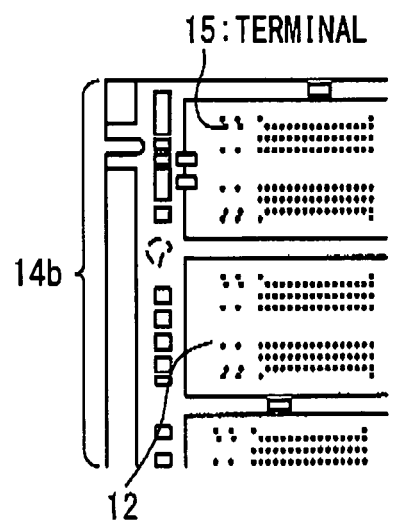

FIGS. 15 and 16 are expanded views of portions of the multi-layer printed circuit board 11 shown in FIGS. 13 and 14. As shown in FIGS. 15 and 16, many terminals 15 are arranged in each of the areas 12 and the area 13 for connections to the logic part and the memories.

Figure 17:
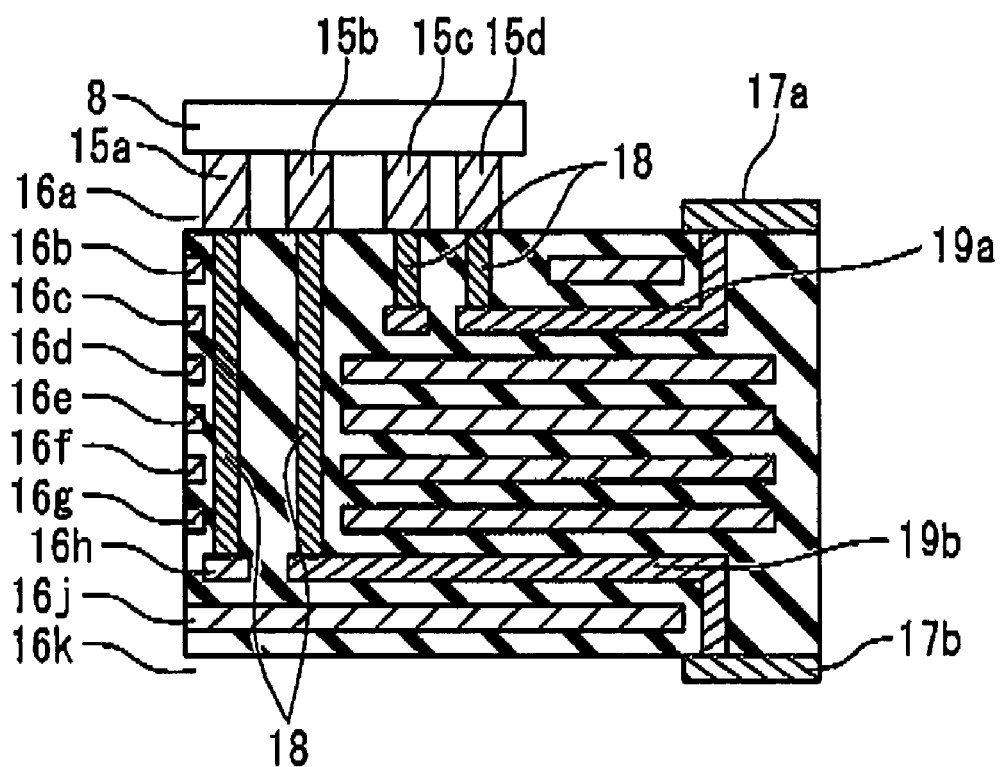
FIG. 17 is a sectional view of the multi-layer printed circuit board in the first embodiment along the line AA' shown in FIG. 15.

FIG. 17 is a cross sectional view along the line AA' shown in FIG. 15. As shown in FIG. 17, the multi-layer printed circuit board 11 has a structure in which a plurality of wiring layers (10 layers; 16a to 16k) are laminated. It should be noted that in this embodiment, a case that the wiring layers of 10 layers are laminated is described. However, the present invention can be applied to a case of 3 layers or more.

In FIG. 17, terminals 15a to 15d for mounting a logic part 8 are shown on the uppermost layer 16a among the plurality of wiring layers 16a to 16k. Also, terminals 17a and 17b for the board connector 14 are provided on the uppermost layer 16a and the lowermost layer 16k among the plurality of wiring layers 16a to 16k, respectively. Among the plurality of wiring layers 16a to 16k, the wiring layer 16d is an inner power source layer, and the wiring layer 16g is a ground layer.

Inter-layer connection components 18 are connected to the respective terminals 15a to 15d. These inter-layer connection components 18 are blind via-holes for carrying out the selective connections between the plurality of wiring layers. It should be noted that in this specification, the blind via-hole implies an inter-layer connection component for carrying out the connection between the layers without penetrating any wiring layer. Among the inter-layer connection components 18, the inter-layer connection component 18 corresponding to the terminal 15d extends to the wiring layer 16c and is connected to a wiring 19a formed on the wiring layer 16c. The wiring 19a is connected through a different inter-layer connection component to the terminal 17a. That is, the terminal 15d for the logic part is electrically connected to the terminal 17a for the board connector. Similarly, the inter-layer connection component 18 connected to the terminal 15b extends to the wiring layer 16h and is connected to the wiring 19b formed on the wiring layer 16h. The wiring 19b is connected through a different inter-layer connection component to the terminal 17b. That is, the terminal 15b for the logic part is electrically connected to the terminal 17b for the board connector.

In this way, since the blind via-holes are used as the inter-layer connection components 18, the wiring 19b connected with the logic part terminal 15b and the board connector terminal 17b and the wiring 19a connected with the logic part terminal 15d and the board connector terminal 17a can be laid on a same section. Since the inter-layer connection component 18 connected to the terminal 15d does not extend to the wiring layer 16h, the wiring 19b is not required to make a detour in a direction that is not parallel to the paper surface. This fact contributes to the improvement of the wiring density.

Also, when the wiring layers 16d and 16g are the power source and ground layers, there is no case that the inter-layer connection components 18 corresponding to the terminal 15d penetrate through the power source and ground layers. Accordingly, the areas of the power source and ground layers can be made larger than those in a case that the penetration through-holes are used as the inter-layer connection components 18. Also, even when the power source and ground layers 16d and 16g are reference layers of the wirings 19a and 19b, the transmission line configuration, which is electrically uniform, can be attained without any suffering from the shape influence of the inter-layer connection components 18.

Figure 18:
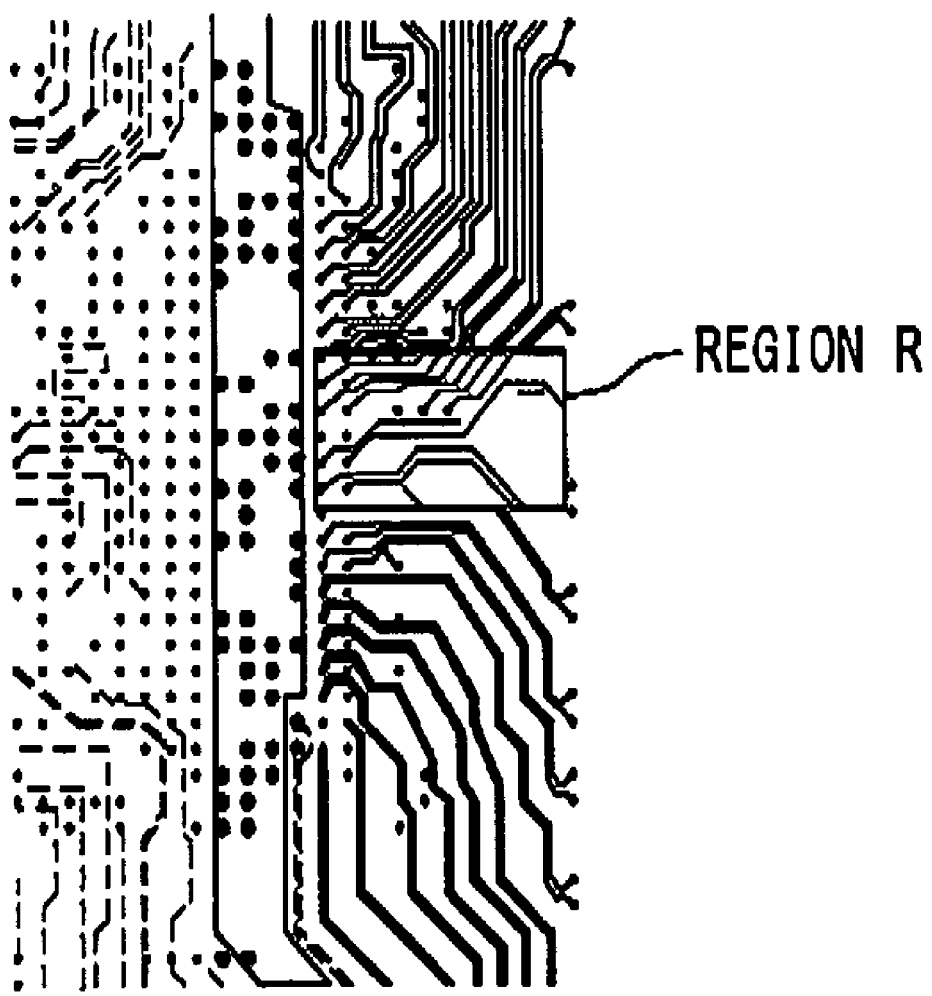
FIG. 18 is a view showing a layout of a layout on an inner wiring layer in the first embodiment.
Figure 19:
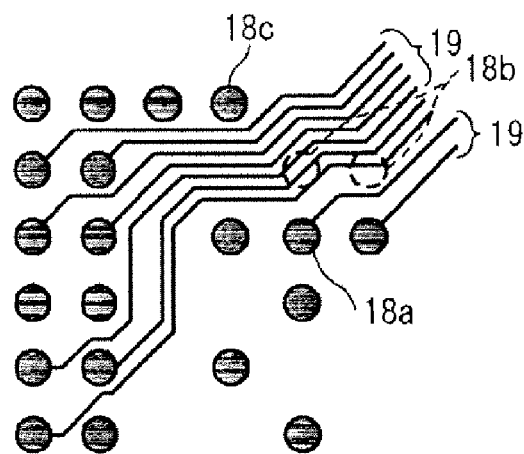
FIG. 19 is a partially expanded view of a portion of the multi-layer printed circuit board in the first embodiment shown in FIG. 18.

In succession, the wiring layout of the wiring layer as the inner layer will be described. FIG. 18 is a diagram showing the wiring layout on the wiring layer (a first wiring layer) 16h among the plurality of wiring layers 16a to 16k. FIG. 19 is an expanded view of a region R shown in FIG. 18.

FIG. 19 shows the arrangement of the plurality of inter-layer connection components 18 and the wirings 19. A plurality of the inter-layer connection components 18 are the blind via-holes as mentioned above. Among the plurality of inter-layer connection components 18, the inter-layer connection component 18 connected to the first wiring layer 16h is shown as a black circle. It should be noted that although being not electrically connected to any wiring 19 on the first layer 16h, an inter-layer connection component 16 formed to extend the first layer 16h in a lamination direction without a connection is shown as if it is connected to the first layer 16h. Also, the inter-layer connection component 18b that is not connected to the first layer 16h is shown by using a dotted line. On the other hand, the wiring 19 functions together with a different wiring as a differential wiring.

Among all the inter-layer connection components 18 shown in FIG. 19, the inter-layer connection component 18a is adjacent to the inter-layer connection component 18b. On the other hand, when only the inter-layer connection components 18 connected to the first layer 16h are considered, the inter-layer connection component 18a is adjacent to the inter-layer connection component 18c while putting the position corresponding to the inter-layer connection component 18b between them.

Figure 21:
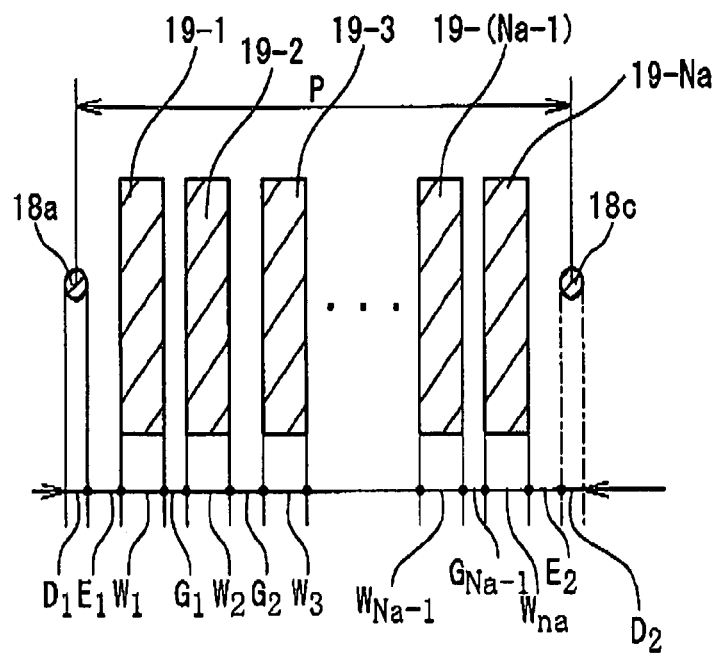
FIG. 21 is a view showing the wirings of a number Na that can be laid between inter-layer connection components.
Figure 22A:
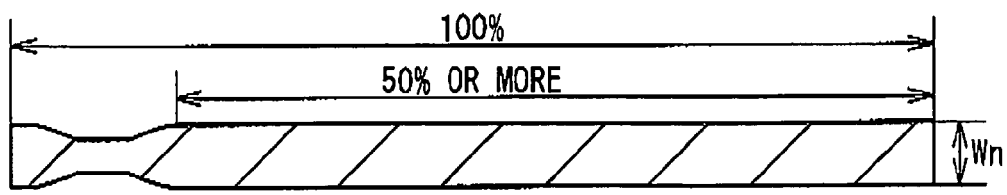
FIGS. 22A and 22B are views showing different types of wirings.
Figure 22B:
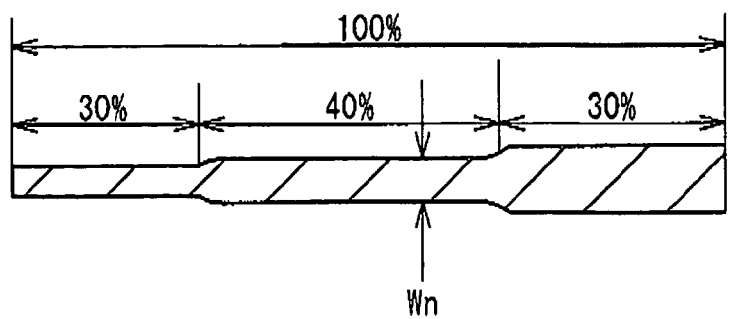

In such a layout, the number Na of the wirings 19 that can be laid between the inter-layer connection component 18a and the inter-layer connection component 18b will be described with reference to FIG. 21. FIG. 21 shows the wirings 19 of the number Na laid between the inter-layer connection components 18 (18a and 18b) adjacent to each other. It is supposed that the outer dimensions of the inter-layer connection components 18a and 18c are $D_1$ and $D_2$, respectively, a minimal space between the (n)-th and (n+1)-th wirings 19 in view of the designing and manufacturing rules is $G_n$, a width of the n-th wiring 19 is $W_n$, minimal spaces between the inter-layer connection components 18 and the wirings adjacent thereto are $E_1$, $E_2$, respectively, and a distance between the centers of the inter-layer connection components 18 is P. In this case, as shown in FIG. 21, the wirings can be arranged for the number that satisfies the equation of $P \geq \{(W_1+W_2+ \ldots +W_{Na-1}+W_{Na})+(G_1+G_2+ - - - +G_{Na-1})+(E_1)+(E_2)+(D_1+D_2)/2\}$. Oppositely, the wirings for the number that can satisfy the above equation can be laid. It should be noted that the width of a segment exceeding 50% of the wiring length is defined as $W_n$ in the above equation, when the wiring width $W_n$ changes in the middle of the wiring, as shown in FIGS. 22A and 22B. Also, if there is no segment exceeding 50%, the width of the segment having the longest length of the wiring is defined as $W_n$. In addition, if the inter-layer connection component 18a is, for example, circular, the foregoing "outer dimension" indicates an "outer diameter".

In the example shown in FIG. 19, the number Na of the wirings 19 that can be laid between the inter-layer connection component 18a and the inter-layer connection component 18c is 7 at the maximum because of the above-mentioned restraint on the number of wirings 19. Actually, the 7 wirings 19 are laid. It should be noted that the inter-layer connection component 18b is the blind via-hole that is not connected to the first layer 16h, and does not prevent the arrangement of the wirings 19.

Figure 20:
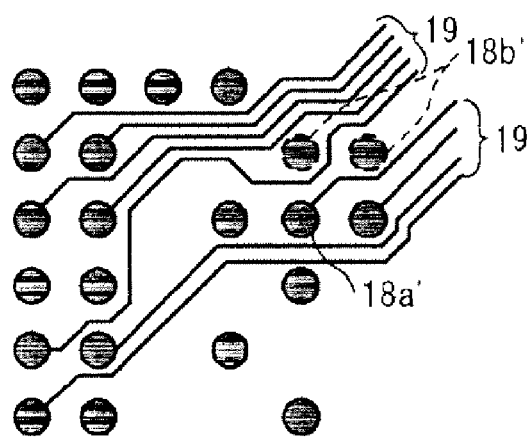
FIG. 20 is another partially expanded view of a portion of the multi-layer printed circuit board in the first embodiment shown in FIG. 18.

On the other hand, FIG. 20 shows an example when the inter-layer connection component 18b' is assumed to be a penetration through-hole, for the sake of a comparison. In the example shown in FIG. 20, the existence of the inter-layer connection component 18b' cannot be ignored. Thus, the maximal number Nb of the wirings that can be laid between the inter-layer connection components 18a' and 18b' is smaller than the number when the blind via-hole is used, and is 5.

In this way, as can be understood from the comparison between FIG. 19 and FIG. 20, since the inter-layer connection component 18b is the blind via-hole, many wirings, e.g., 7 wirings can be laid between the inter-layer connection components adjacent to each other in this embodiment.

Also, in the example shown in FIG. 20, the inter-layer connection component 18b' serves as an obstacle. Accordingly, there is a case that the width of the wiring 19' must be made thin between the inter-layer connection component 18a' and 18'. When the wiring width is changed depending on the position, the characteristics of transmission signals are not uniform. That is, this example indicates that the wirings are not electrically uniform. On the contrary, in the example shown in FIG. 19, the wirings 19 are constant in width, and are the electrically uniform wirings. In particular, when the wiring 19 is the differential wiring, the wiring cannot be laid on a different layer. Therefore, as described in the example shown in FIG. 20, the width of the wiring 19' must be made thin and laid in many cases.

Moreover, in the example shown in FIG. 20, the wiring 19' is required to extend while being bent in order to avoid the inter-layer connection component 18b'. The bent segment has influence on the characteristic impedance of the wiring pattern and results in the factor that degrades the quality of the transmission signal. On the contrary, in the example shown in FIG. 19, the wiring 19 can extend straightly, and the bent segment can be reduced, which is preferable from the viewpoint of the signal quality.

Figure 23:
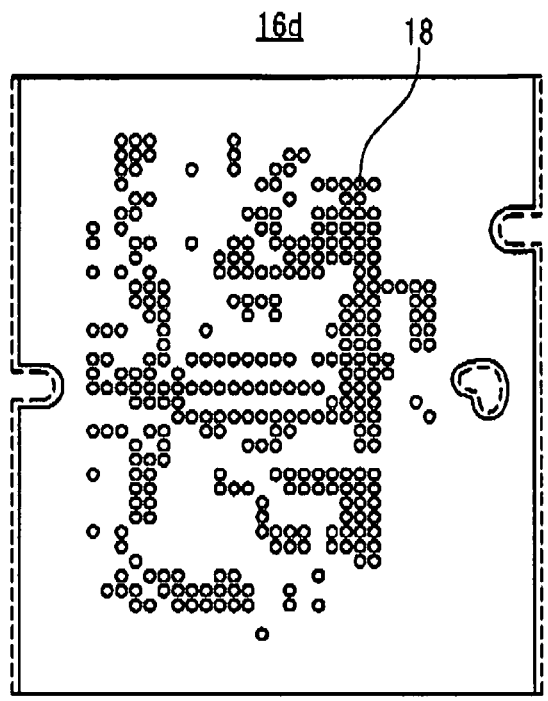
FIG. 23 is a view showing a power source and ground layer of the multi-layer printed circuit board according to the first embodiment.

Next, the shapes of the layouts of the power source and ground layers will be described. FIG. 23 shows a layout of the wiring layer 16d in the multi-layer printed circuit board according to this embodiment. That is, FIG. 23 shows the layout of the power source layer. It should be noted that a layout of the ground layer that is the wiring layer 16g is also similar. On the other hand, FIG. 24 shows the shape of the power source layer in the example in which all of the inter-layer connection components 18' are assumed to be the penetration through-holes, for a comparison.

Figure 24:
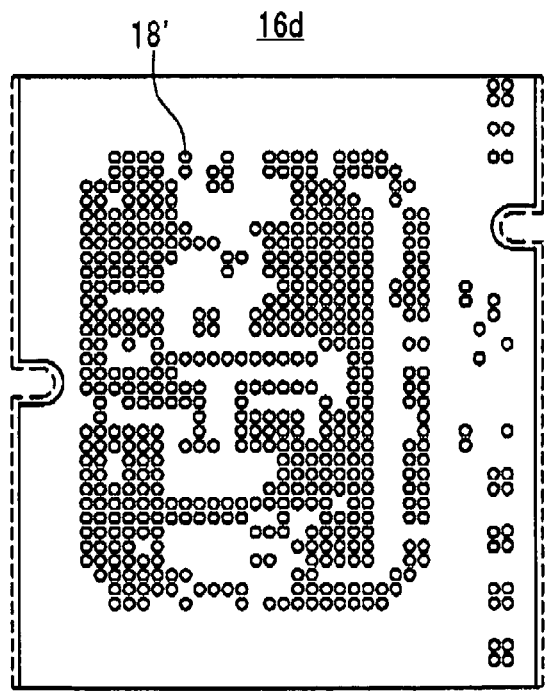
FIG. 24 is a view showing the power source and ground layer in which penetration through-holes are used.

As can be understood from the comparison between FIG. 23 and FIG. 24, since the inter-layer connection component 18 is the penetration through-hole, the number of the openings (the anti-pads) formed in the power source layer is decreased in this embodiment. That is, it is known that the impedance increase in the power source layer can be minimized since the area of the conductor can be set large.

Figure 25:
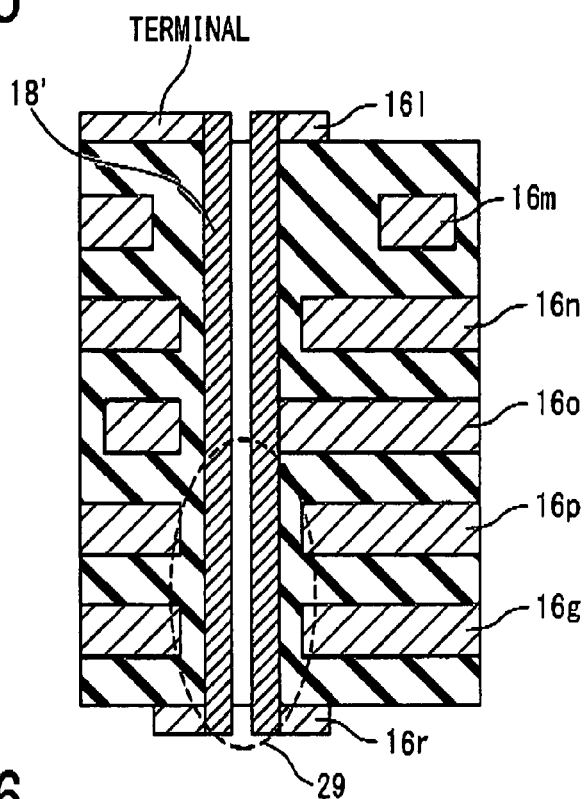
FIG. 25 is a sectional view of the multi-layer printed circuit board in which a penetration through-hole is used.
Figure 26:
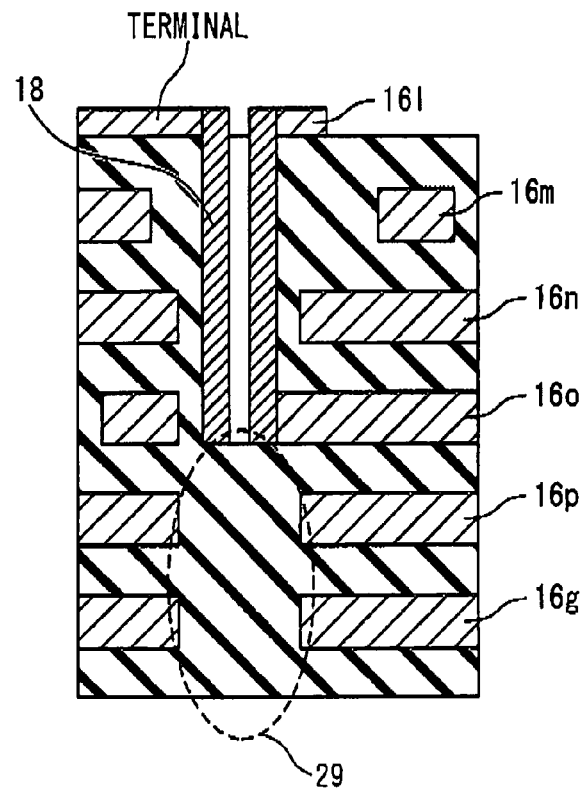
FIG. 26 is a sectional view of a multi-layer printed circuit board in which a blind via-hole is used.
Figure 27:
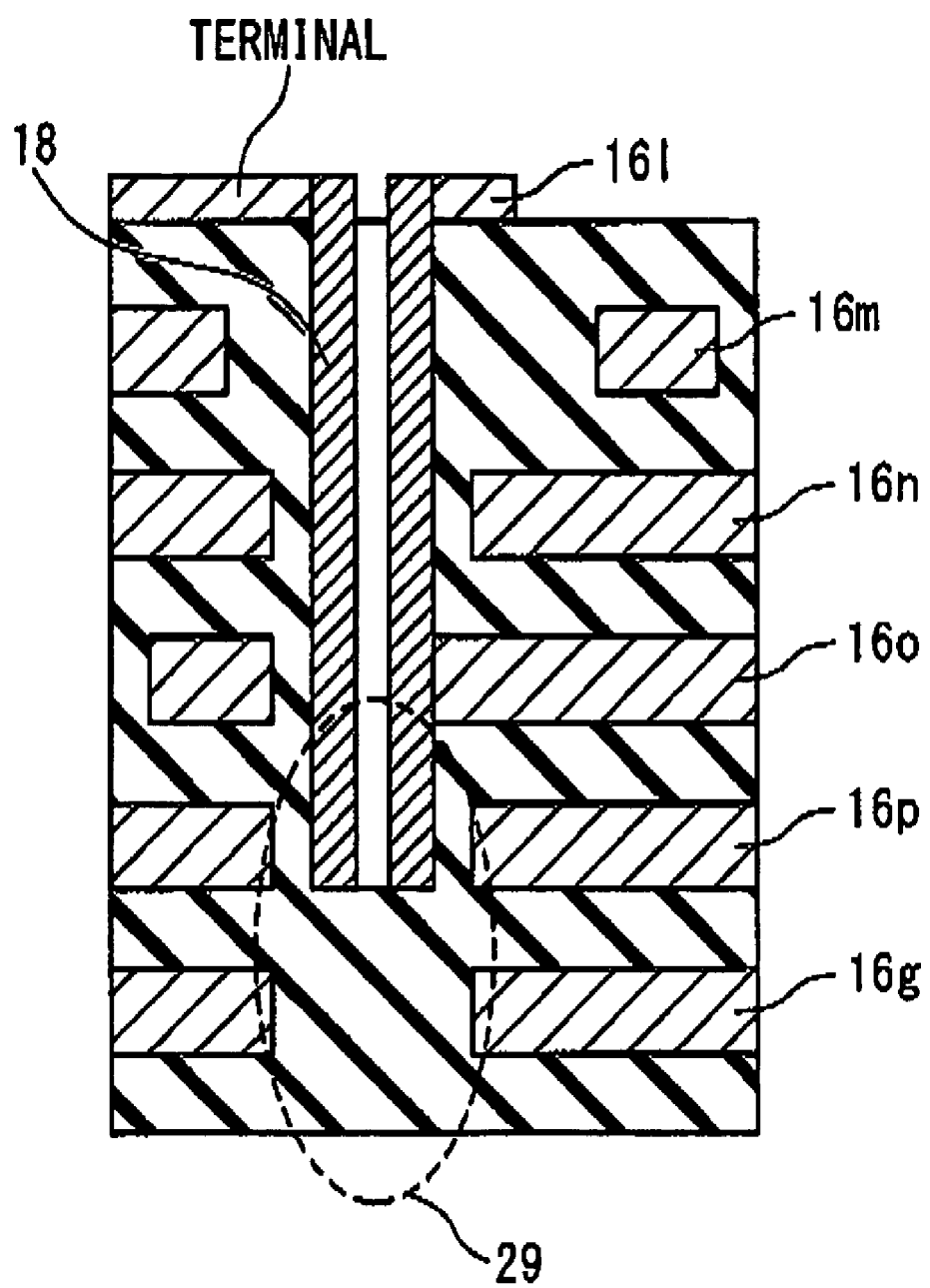
FIG. 27 is a sectional view of the multi-layer printed circuit board in which a blind via-hole is used.

Also, as described in this embodiment, the use of the blind via-hole improves the quality of the transmission signal from the viewpoint of a stub (branch). The quality of the transmission signal and the stub will be described with reference to FIGS. 25 to 27. FIG. 25 shows a sectional shape of a printed circuit board when a penetration through-hole is used as the inter-layer connection component 18. On the other hand, FIGS. 26 and 27 are sectional views when the blind via-hole is used as the inter-layer connection component 18. In all the examples shown in FIGS. 25 to 27, the wiring provided in the wiring layer 16o is connected to the terminal mounted on the uppermost layer 16l through the inter-layer connection component 18. However, although the inter-layer connection component 18 penetrates through the board in the example shown in FIG. 25, the inter-layer connection component 18 only extends to the wiring layer 16o in the example shown in FIG. 26. Also, in the example shown in FIG. 27, the inter-layer connection component 18 extended to the wiring layer 16p.

In the example shown in FIG. 25, among the inter-layer connection components 18, the segment (a stub 29) between the wiring layer 16o and the wiring layer 16r serves as a capacitive load. Such a capacitive load results in a factor that degrades the quality of the transmission signal. On the contrary, in the examples shown in FIGS. 26 and 27, the stub segment is perfectly removed (FIG. 26) or reduced (FIG. 27). That is, since the inter-layer connection component 18 is formed as the blind via-hole, the stub 29 can be removed or reduced, which can prevent the quality degradation in the transmission signal that is caused by the existence of the stub.

Second Embodiment

Figure 28:
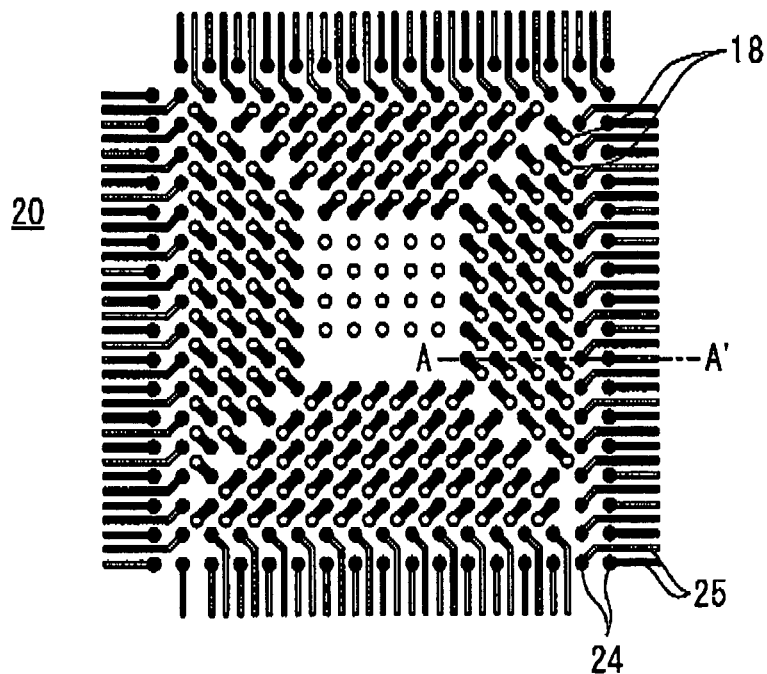
FIG. 28 is a plan view showing the part mounting surface of the multi-layer printed circuit board according to a second embodiment of the present invention.
Figure 29:
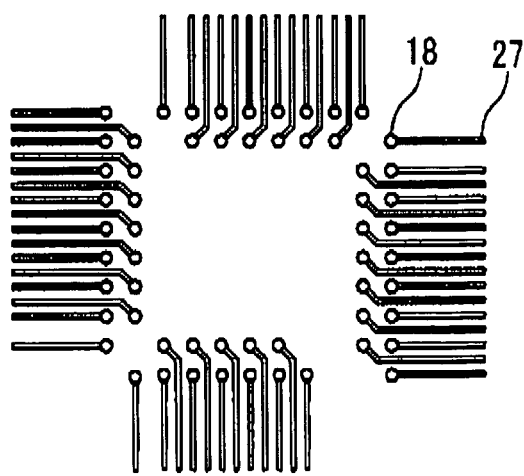
FIG. 29 is a rear view showing a rear surface of the multi-layer printed circuit board according to the second embodiment.
Figure 30:
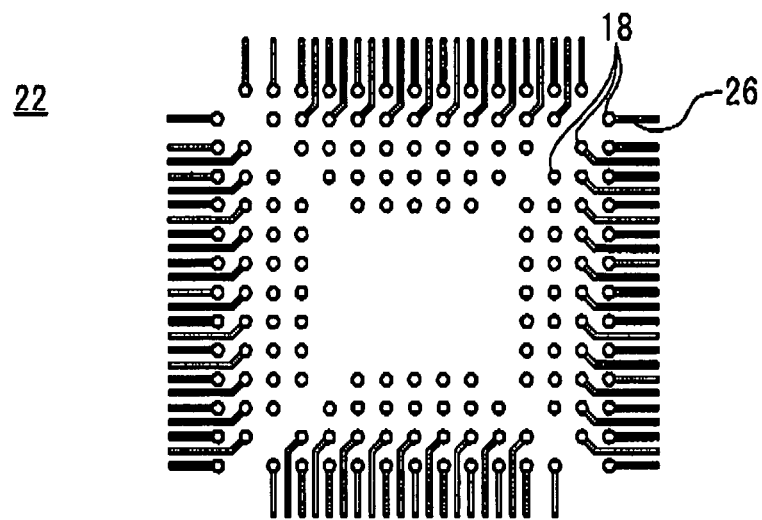
FIG. 30 is a plan view showing an inner wiring layer of the multi-layer printed circuit board according to the second embodiment.
Figure 31:
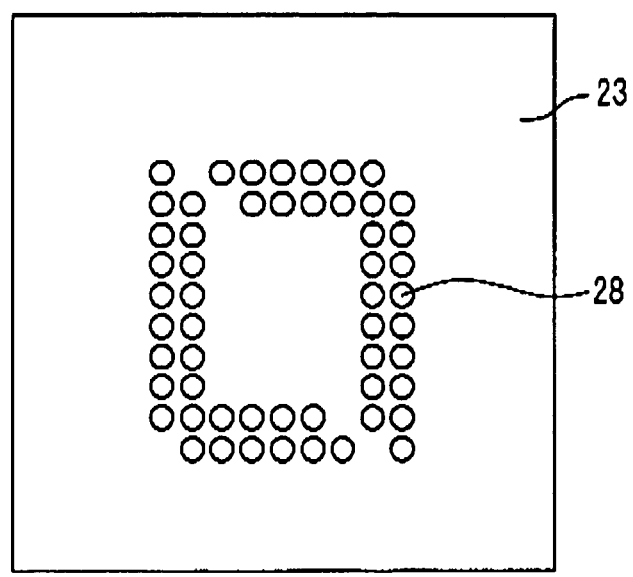
FIG. 31 is a view showing the power source and ground layer of the multi-layer printed circuit board according to the second embodiment.
Figure 32:
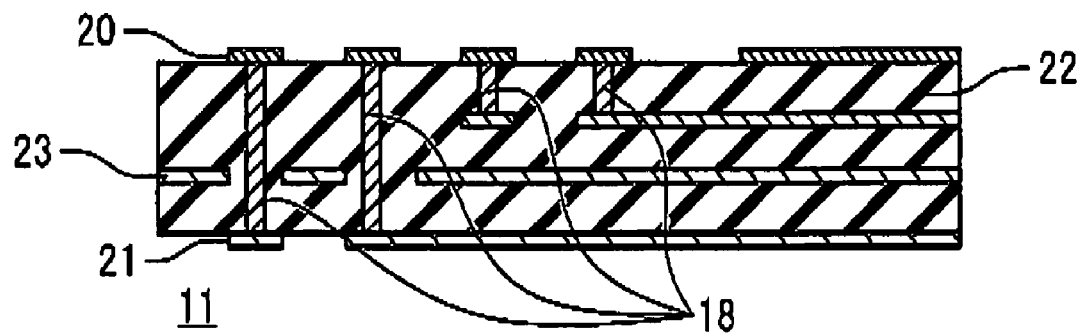
FIG. 32 is a sectional view of the multi-layer printed circuit board according to the second embodiment.

Next, the multi-layer printed circuit board according to a second embodiment of the present invention will be described below with reference to FIGS. 28 to 32. FIGS. 28 to 32 are diagrams showing the wiring layouts of the respective wiring layers in the multi-layer printed circuit board 11 according to this embodiment, FIG. 28 shows a mounting surface 20 on which the memories are mounted, FIG. 29 shows a rear surface 21, FIG. 30 shows an inner wiring layer 22, and FIG. 31 shows a power source and ground layer 23. Also, FIG. 32 is a sectional view of the multi-layer printed circuit board 11. As shown in FIG. 32, the rear surface layer 21, the power source and ground layer 23, the inner wiring layer 22 and the mounting surface 20 are laminated in this order in the multi-layer printed circuit board 11. This multi-layer printed circuit board 11 contains penetration through-holes and blind via-holes as the inter-layer connection components 18.

As shown in FIG. 28, many terminals 24 for mounting the memories are arranged on the mounting surface 20. Wirings 25 extending on the mounting surface 20 are connected to terminals 24 located on the outer side, among the terminals 24. On the other hand, the wirings 25 extending from the inter-layer connection components 18 are connected to the terminals 24 located on the central side.

As shown in FIG. 30, in the inner wiring layer 22, wirings 26 are connected to the inter-layer connection components 18 on the outer side. The wirings 26 are not connected to the inter-layer connection components 18 on the central side. The inter-layer connection components 18 on the central side are formed to penetrate through the power source and ground layer 23 and further extend to the rear surface 21 of the lowermost layer.

As shown in FIGS. 29 and 32, only the inter-layer connection components 18 on the central side are connected to the rear surface 21. The wirings 27 extending on the rear surface 21 are connected to the inter-layer connection components 18 on the central side.

Figure 1:
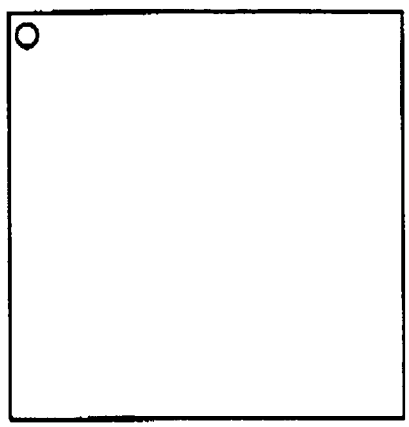
FIG. 1 is a top view of a logic part.
Figure 2:
FIG. 2 is a side view of the logic part.
Figure 3:
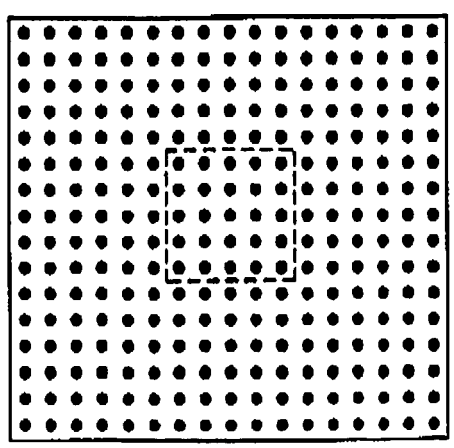
FIG. 3 is a rear view of the logic part.
Figure 4:
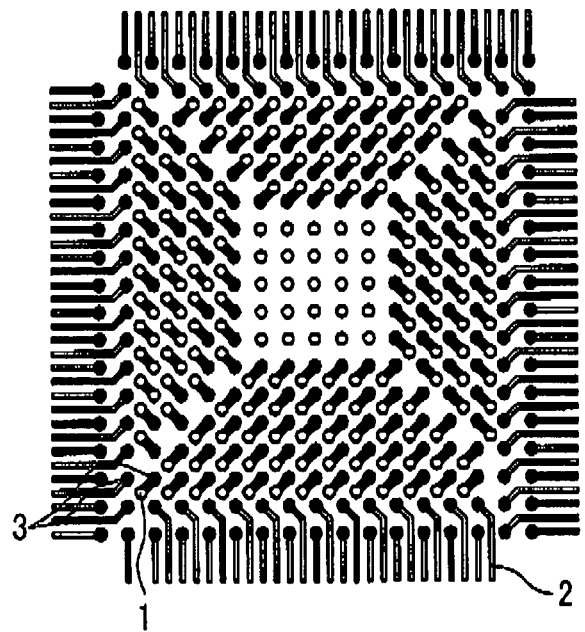
FIG. 4 is a plan view showing a layout in a part mounting surface of a conventional multi-layer printed circuit board.
Figure 5:
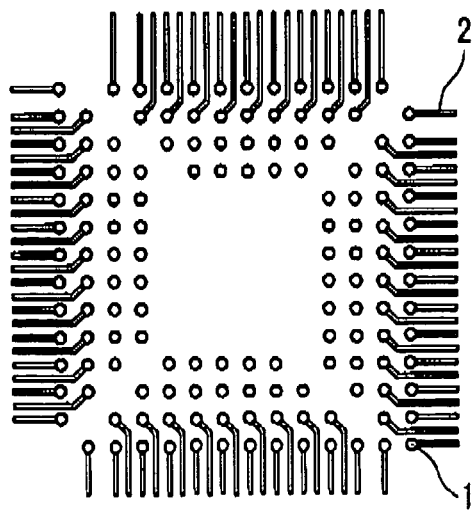
FIG. 5 is a plan view showing a layout in a rear surface of the conventional multi-layer printed circuit board.
Figure 6:
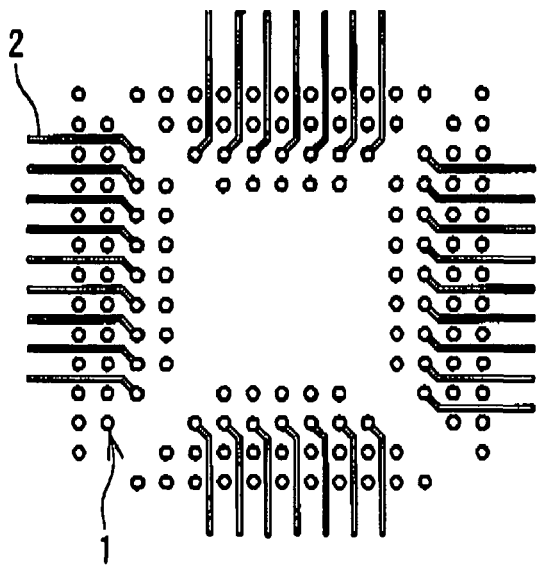
FIGS. 6 and 7 are diagrams showing layouts in an inner wiring layers of the conventional multi-layer printed circuit board.
Figure 7:
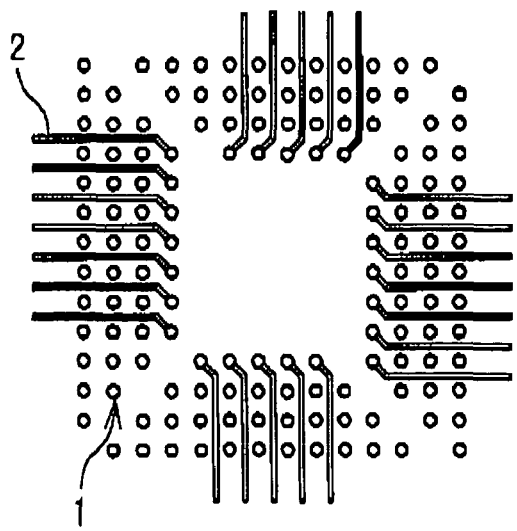
Figure 8:
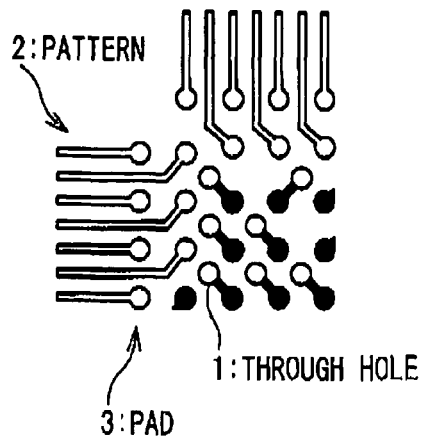
FIG. 8 is an expanded view of a portion of the part mounting surface.
Figure 9:
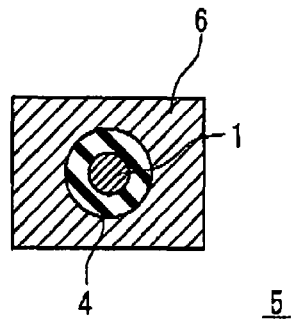
FIG. 9 is a view showing an anti-pad.
Figure 10:
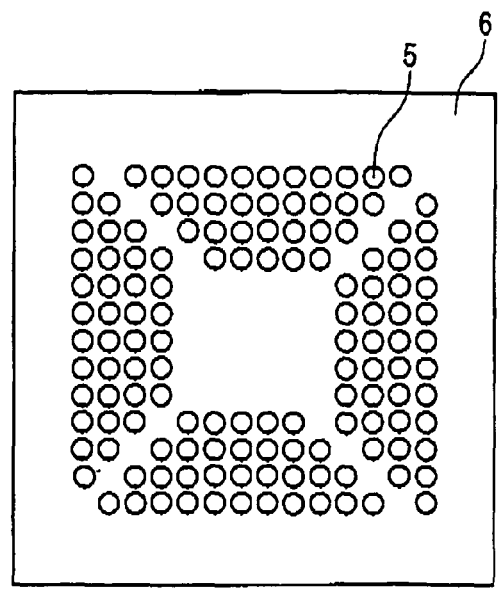
FIG. 10 is a diagram showing a power source and ground layer of the conventional multi-layer printed circuit board.
Figure 11:
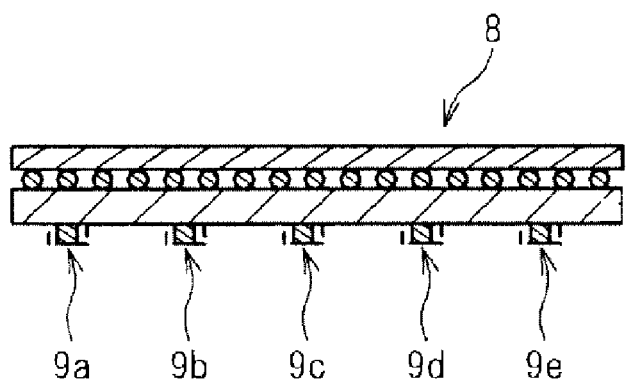
FIG. 11 is a sectional view showing an example in which a typical logic part and impedance decreasing parts are mounted.
Figure 12:
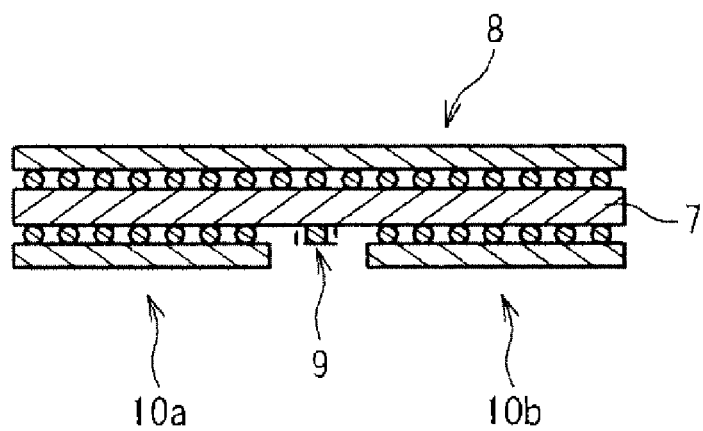
FIG. 12 is a sectional view showing an example in which a logic part for a memory module is mounted.

As shown in FIG. 31, in the power source and ground layer 23, anti-pads 28 are formed only in the positions corresponding to the inter-layer connection components 18 on the central side. The inter-layer connection components 18 connected to the wirings 26 on the inner wiring layer 22 are not required to further extend to the lower layer side. Thus, this has no influence on a layout of the power source and ground layer 23. In this embodiment, an area of the anti-pad region in the power source and ground layer 23 can be reduced, as compared with the penetration through-holes shown in FIG. 10. As a result, the area of a conductor region in the power source and ground layer 23 can be increased, which can suppress the impedance increase that is caused by the formation of the anti-pads 28.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A multi-layer wiring circuit board comprising:
an insulating base member having a top surface and a bottom surface;
a multi-level wiring structure provided in the insulating base member and including a lower-level wiring and an upper-level wiring over the lower-level wiring, each of the lower-level wiring and the upper-level wiring being buried in the insulating base member, the lower-level wiring including a first wiring layer and a second wiring layer, and the upper-level wiring including a third wiring layer;
a first blind via-hole extending from the top surface of the insulating base member toward the bottom surface with a first depth so that the first blind via-hole is in contact with and terminates at the first wiring layer of the lower-level wiring;

a second blind via-hole extending from the top surface of the insulating base member toward the bottom surface with the first depth so that the second blind via-hole is in contact with and terminates at the second wiring layer of the lower-level wiring;

a third blind via-hole adjacent to the second blind via-hole and extending from the top surface of the insulating base member toward the bottom surface with a second depth that is smaller than the first depth, so that the third blind via-hole is in contact with and terminates at the third wiring layer; and the lower-level wiring further including a plurality of fourth wiring layers that run between the first and second blind via-holes while overlapping with the third blind via-hole with an intervention of a part of the insulating base member.

2. The board as claimed in claim 1, wherein the board further comprises:

a through via-hole extending from the top surface of the insulating base member to the bottom surface with isolation from each of the first to third blind via-holes and from each of the first to fourth wiring layers; and a conductive layer formed on the bottom surface of the insulating base member and in contact with the through via-hole.

3. The board as claimed in claim 1, further comprising a plurality of fourth blind via-holes each extending from the top surface of the insulating base member toward the bottom surface with the first depth so that each of the fourth blind via-holes is in contact with an associated one of the fourth wiring layers of the lower-level wiring.

4. A device comprising a multi-layer wiring circuit board and at least one electronic component mounted on the multi-layer wiring circuit board, the multi-layer wiring circuit board comprising:

an insulating base member having a top surface and a bottom surface;

a multi-level wiring structure provided in the insulating base member and including a lower-level wiring and an upper-level wiring over the lower-level wiring, each of the lower-level wiring and the upper-level wiring being buried in the insulating base member, the lower-level wiring including a first wiring layer and a second wiring layer, and the upper-level wiring including a third wiring layer;

a first blind via-hole extending from the top surface of the insulating base member toward the bottom surface with a first depth so that the first blind via-hole is in contact with and terminates at the first wiring layer of the lower-level wiring;

a second blind via-hole extending from the top surface of the insulating base member toward the bottom surface with the first depth so that the second blind via-hole is in contact with and terminates at the second wiring layer of the lower-level wiring; and a third blind via-hole formed adjacent to the second blind via-hole and extending from the top surface of the insulating base member toward the bottom surface with a second depth that is smaller than the first depth, so that the third blind via-hole is in contact with and terminates at the third wiring layer;

the lower-level wiring further including a plurality of fourth wiring layers that run between the first and second blind via-holes while overlapping with the third blind via-hole with an intervention of a part of the insulating base member.

5. The device as claimed in claim 4, wherein the board further comprises:

a through via-hole extending from the top surface of the insulating base member to the bottom surface with isolation from each of the first to third blind via-holes and from each of the first to fourth wiring layers; and a conductive layer formed on the bottom surface of the insulating base member and in contact with the through via-hole.

6. The device as claim in claim 4, further comprising a plurality of fourth blind via-holes each extending from the top surface of the insulating base member toward the bottom surface with the first depth so that each of the fourth blind via-holes is in contact with an associated one of the fourth wiring layers of the lower-level wiring.

\* \* \* \* \*